United States Patent [19]

Shimada

[11] Patent Number: 4,768,009
[45] Date of Patent: Aug. 30, 1988

[54] COIL ARRANGEMENT FOR CORRECTION OF MAGNETIC FIELD

[75] Inventor: Mamoru Shimada, Yokohama, Japan

[73] Assignee: Kabushiki Kaisha Toshiba, Kawasaki, Japan

[21] Appl. No.: 46,181

[22] Filed: May 5, 1987

[30] Foreign Application Priority Data

May 7, 1986 [JP] Japan .................................. 61-104193

[51] Int. Cl.$^4$ .............................................. H01F 5/00
[52] U.S. Cl. ..................................... 335/299; 324/320
[58] Field of Search ................ 335/216, 299; 324/318, 324/319, 320, 321

[56] References Cited

U.S. PATENT DOCUMENTS

| | | | |
|---|---|---|---|
| 4,500,860 | 2/1985 | Vermilyea | 324/320 X |
| 4,506,247 | 3/1985 | Vermilyea | 335/299 X |
| 4,523,166 | 6/1985 | Gross | 324/320 X |
| 4,644,281 | 2/1987 | Savelainen | 324/319 X |
| 4,658,229 | 4/1987 | Chen et al. | 335/299 |
| 4,689,591 | 8/1987 | McDougall | 335/299 |

OTHER PUBLICATIONS

Proceedings of the Tenth Int'l. Cryogenic Engineering Conference, Jul. 31-Aug. 3, 1984, ICEC10, Edited by Dr. H. Collan et al., pp. 44-53.

Primary Examiner—George Harris
Attorney, Agent, or Firm—Foley & Lardner, Schwartz, Jeffery, Schwaab, Mack, Blumenthal & Evans

[57] ABSTRACT

To correct error magnetic field components with respect to Z axis included in a fundamental magnetic field when the direction of the fundamental magnetic field is taken in the direction of Z axis of the Cartesian coordinate system, ring-shaped correction coils, which are $(1+N_m/2)$ pairs of coils when the maximum order $N_m$ of the error magnetic field components to be corrected with respect to Z axis is even, and which are $\{1+(N_m-1)/2\}$ pairs of coils when the maximum order $N_m$ is odd, are coaxially disposed symmetrically on the both sides of a Z axis reference point taken as the center in the Z-axis direction so as to include positions where the $(N_m+2)$th order error magnetic field components are not produced.

7 Claims, 5 Drawing Sheets

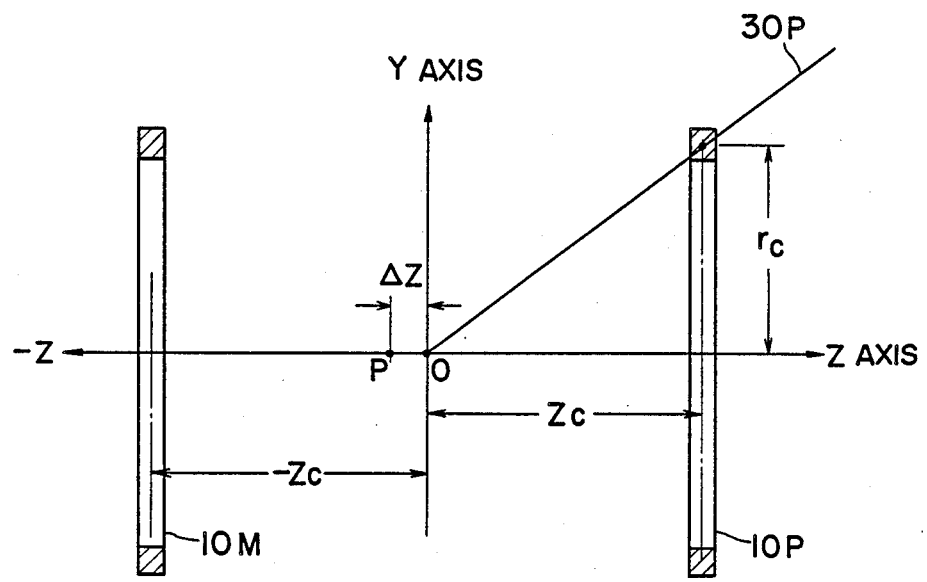
F I G. 1

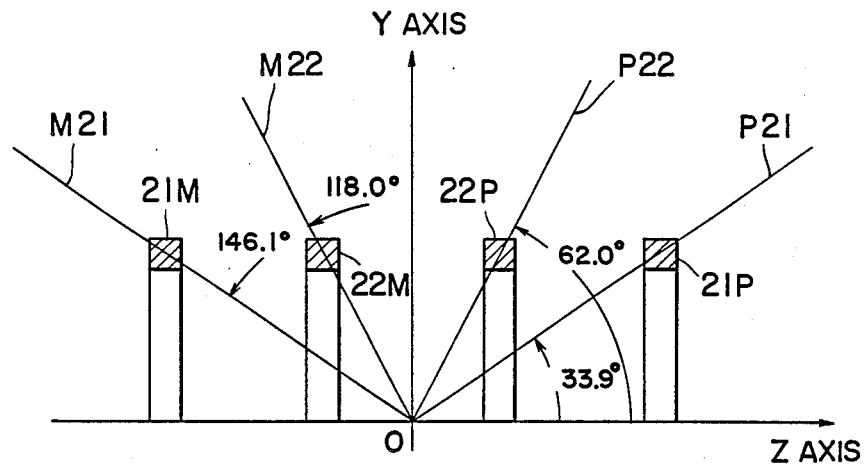
F I G. 6
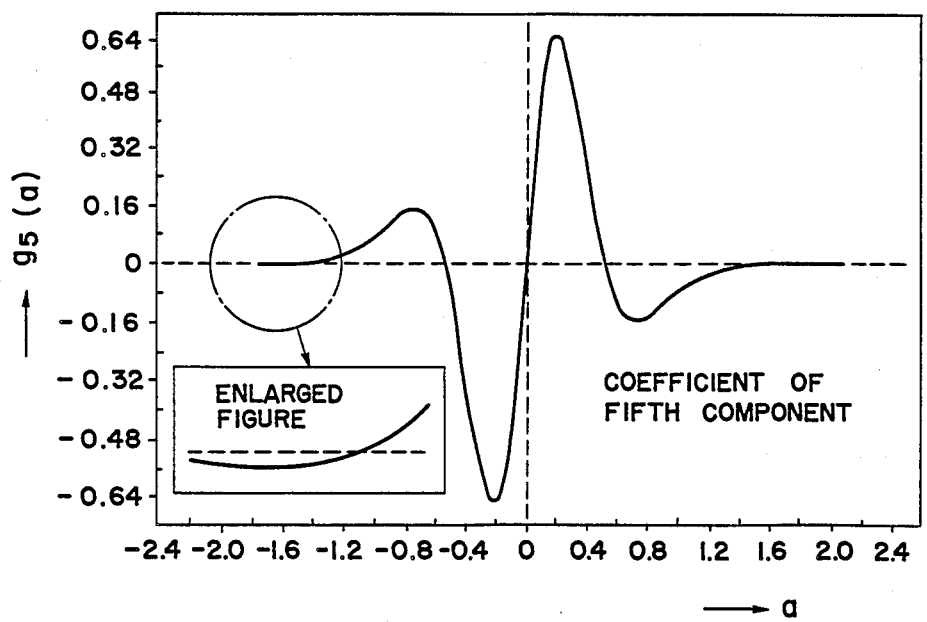
F I G. 7

COIL ARRANGEMENT FOR CORRECTION OF MAGNETIC FIELD

BACKGROUND OF THE INVENTION

1. Field of the Art

The present invention relates to a coil arrangement for correction of magnetic field used in an imaging equipment utilizing nuclear magnetic resonance (NMR) or the like, and more particularly to a coil arrangement for correction of magnetic field wherein when the direction of a fundamental magnetic field is assumed as Z axis of the Cartesian or rectangular coordinate system, the coil arrangement is provided with at least one pair of ring-shaped coils for correcting error magnetic field components with respect to Z axis included in the fundamental magnetic field.

2. Prior Art

In imaging equipment using NMR, a high uniform or homogeneous magnetic field is required. For this reason, the coil arrangement for producing a fundamental magnetic field is designed so as to produce a high homogeneous magnetic field. However, when the coil arrangement is actually excited, the magnetic field is disturbed due to the influence of magnetic material such as iron existing therearound to produce error magnetic field components. To cancel such error magnetic components to improve homogeneity of the magnetic field, a coil arrangement for correction of magnetic field is used.

The coil arrangement of this kind is described, for example, in the paper entitled "SUPERCONDUCTING MAGNETS FOR NMR IMAGING AND IN-VIVO SPECTROSCOPY" reported by the Oxford Instruments Group in "Proceedings of the Tenth Internationl Cryogenic Engineering Conference (HELSINKI, 1984)".

In this paper, in the case of correcting respective error magnetic components $H_0$, $H_1$, $H_2$, ... from the zeroth order with respect to Z axis, magnetic field correction coils dedicated for respective components are used for making corrections per each component. For this reason, for example, for coils for correction of the first to fourth order magnetic fields, one pair, four pairs, two pairs and four pairs, are required respectively. When an attempt is made to correct a magnetic field using a coil producing only a certain specified order component in accordance with the prior art, other order components would be produced as well, although they are small. Thus, there occurs the inconvenience that such other components degrade the homogeneity of the magnetic field. A further problem is that since correction is made per each order component as previously described, a large number of coils are required in correspondence with the order components to be corrected in order to reduce various order components to only a specified single component.

SUMMARY OF THE INVENTION

It is therefore an object to provide a coil arrangement for correction of magnetic field capable of precisely correcting error components with respect to Z axis using fewer coils.

To achieve this object, in the coil arrangement for correction of magnetic field according to the present invention, the maximum order of error magnetic field components to be corrected with respect to Z axis is assumed as $N_m$, and each of the two ring-shaped correction coils composed of one pair is coaxially disposed symmetrically on the both sides, respectively, of a Z axis reference point taken as the center in the direction of Z axis so as to include positions where the error magnetic field component of the $(2+N_m)$th order is not produced. When the maximum order $N_m$ is even, $(1+N_m/2)$ pairs of correction ring-shaped coils are provided. When the maximum order $N_m$ is odd, $(1+(N_m-1)/2)$ pairs of correction coils are provided.

BRIEF DESCRIPTION OF THE DRAWINGS

In the drawings:

FIG. 1 is a longitudinal cross sectional view illustrating a pair of ring-shaped coils for explanation of the present invention;

FIGS. 2, 4, 5, 6, 8 and 9 are longitudinal cross sectional views illustrating the arrangements of a ring-shaped coil in different embodiments according to the present invention;

FIGS. 3 and 7 are graphs showing functions for determining the coil arrangements in FIGS. 2 and 6, respectively.

DETAILED DESCRIPTION OF THE INVENTION

Figure 2:
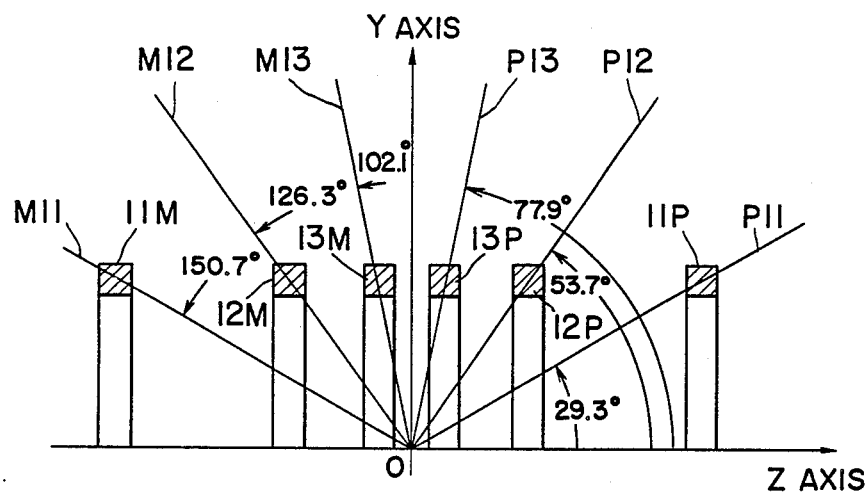

The principle of the present invention will be described with reference to FIG. 1.

When a ring-shaped coil 10P having an effective radius $r_c$ is placed at the position $Z=Z_c$ on Z axis and a current I is caused to flow as shown in FIG. 1, a magnetic field B produced at the point P of $Z=-\Delta Z$ is expressed on the Z axis using the space permeability $\mu_o$ as follows:

$$B = (\mu_o I \cdot r_c^2/2) \times [r_c^2 + (Z_c + (Z_c + \Delta Z)^2]^{-3/2} \quad (1)$$
$$= (\mu_o I \cdot r_c^2/2) \times (r_c^2 + Z_c^2)^{-3/2} \times$$
$$[1 + (2Z_c \cdot \Delta Z + \Delta Z^2) \div (r_c^2 + Z_c^2)]^{-3/2}.$$

In the vicinity of $\Delta Z \approx 0$, by allowing the above equation (1) to be subjected to series expansion, the magnetic field B can be expressed as follows:

$$B = \sum_{i=0}^{\infty} g_i(a) \cdot (\Delta Z)^i, \quad (2)$$

where $a = Z_c/r_c$.

When the coils 10P and 10M are disposed at $Z=Z_c$ and $Z=-Z_c$, respectively, i.e., a pair of coils 10P and 10M are coaxially disposed symmetrically on the both sides of a reference point 0 on Z axis, and when a current is caused to flow through the both coils in the same direction, the suffix i of only even order remains in the equation (2). Assuming that $g_i(a)$ and $\Delta Z^i$ are expressed as $g_i$ and $Z^i$ for the brevity hereinafter, respectively, a magnetic field expressed below is produced:

$$B = g_0 \cdot Z^0 + g_2 \cdot Z^2 + g_4 \cdot Z^4 + \ldots g_{2N} \cdot \quad (3)$$
$$Z^{2N} + g_{2(N+1)} \cdot Z^{2(N+1)} + \ldots.$$

In contrast, when a current of the opposite direction is caused to flow through the both coils 10P and 10M, the suffix i of only odd order remains in the equation (2), a magnetic field indicated below by the same simplified expression as the above is produced:

$$B = g_1 \cdot Z^1 + g_3 \cdot Z^3 + g_5 \cdot Z^5 + \ldots g_{2N+1} \cdot \qquad (4)$$
$$Z^{2N+1} + g_{2(N+1)+1} \cdot Z^{2(N+1)+1} + \ldots$$

In the case of correcting the error magnetic fields of up to 2Nth order in the equation (3) indicating that the magnetic field of the even order is produced, when each coil pair is disposed at the position of $g_{2(N+1)} = 0$, this coil system does not magnetic field of 2(N+1)th order. An angle $\theta_j$ that the locus of the magnetic field on XY plane at that position makes with respect to Z axis is obtained by the following equation (5):

$$\theta_j = \pi/2 - \tan^{-1}(g_i^{-1}(0)_j) \qquad (5)$$

where $g_i^{-1}(0)_j$ is the j-th solution which gives $g_i(a) = 0$.

Assuming that the fundamental magnetic field is referred to as $B_0$ and only error magnetic field of even order up to 2N order with respect to Z axis included in the fundamental magnetic field is considered, the fundamental magnetic field $B_0$ is expressed as follows:

$$B_0 = g_0 \cdot Z^0 + g_2 \cdot Z^2 + \ldots + g_{2N} \cdot N^{2N} \qquad (6).$$

Assuming now that $2N = N_m$, respective magnetic fields produced by $N+1 = 1 + N_m/2$ pairs of coils are expressed by the following equation (7) when the coefficient of the magnetic field by the i-th coil is referred to as $g_N{}^i$ and the coil current of the j-th pair is referred to as $I_j$:

$$B_1 = (g_0{}^1 \cdot Z^0 + g_2{}^1 \cdot Z^2 + \ldots + g_{2N}^1 \cdot Z^{2N})I_1, \qquad (7)$$
$$B_2 = (g_0{}^2 \cdot X^0 + g_2{}^2 \cdot X^2 + \ldots + g_{2N}^2 \cdot Z^{2N})I_2,$$
$$\cdot$$
$$\cdot$$
$$\cdot,$$

and $$B_{N+1} = (g_0^{N+1} \cdot Z^0 + g_2^{N+1} \cdot Z^2 + \ldots + g_{2N}^{N+1} \cdot Z^{2N})I_{N+1}.$$

Accordingly, when the matrix having $(N+1)$ rows and $(N+1)$ columns is assumed, the following relationship is derived:

$$\begin{vmatrix} I_1 \\ I_2 \\ \cdot \\ \cdot \\ \cdot \\ I_{N+1} \end{vmatrix} = G^{-1} \begin{vmatrix} g_0 \\ g_2 \\ \cdot \\ \cdot \\ \cdot \\ g_{2N} \end{vmatrix} \times (-1) \qquad (8)$$

In this case, $$G = \begin{vmatrix} g_0{}^1 & g_0{}^2 \ldots g_0^{N+1} \\ g_2{}^1 & g_2{}^2 \ldots g_2^{N+1} \\ \cdot \\ \cdot \\ \cdot \\ g_{2N}^1 & g_{2N}^2 \ldots g_{2N}^{N+1} \end{vmatrix}$$

by causing current values $I_1$ to $I_{N+1}$ determined by G to flow through respective coil pairs, it is possible to simultaneously cancel errors of up to the $2N(=N_m)$th order.

Similarly, in the case of correcting error magnetic fields of up to the $(2N+1)$th order in the above equation (4) indicating that the magnetic field of odd order is produced, when respective coil pairs are disposed at the position of $g_{2(N+1)+1} = 0$, this coil system does not produce the magnetic field of $\{2(N+1)+1\}$th order. An angle $\theta_j$ that the locus on ZY plane at that position makes with respect to Z axis is obtained using the above-described equation (5).

In the same manner as in the case of the even order, the fundamental magnetic field is designated as $B_0$ and only error magnetic fields of odd order up to the $(2N+1)$th order with respect to Z axis included in the fundamental magnetic field $B_0$ are considered, the fundamental magnetic field $B_0$ being expressed as follows:

$$B_0 = g_1 \cdot Z^1 + g_3 \cdot Z^3 + \ldots + g_{2N+1} \cdot Z^{2N+1} \qquad (9).$$

Assuming now that $2N+1 = N_m$, magnetic fields produced by respective $N+1(=(1+N_m)/2)$ pairs of coils are expressed as follows:

$$B_1 = (g_1{}^1 \cdot Z^1 + g_3{}^1 \cdot Z^3 + \ldots + g_{2N+1}^1 \cdot Z^{2N+1})I_1, \qquad (10)$$
$$B_2 = (g_1{}^2 \cdot Z^1 + g_3{}^2 \cdot Z^3 + \ldots + g_{2N+1}^2 \cdot Z^{2N+1})I_2,$$
$$\cdot$$
$$\cdot$$
$$\cdot$$
$$B_{N+1} = (g_1^{N+1} \cdot Z^1 + g_3^{N+1} \cdot Z^3 + \ldots + g_{2N+1}^{N+1} \cdot Z^{2N+1})I_{N+1}.$$

Accordingly, when the matrix having $(N+1)$ rows and $(N+1)$ columns is assumed, the following relationship is derived.

$$\begin{vmatrix} I_1 \\ I_2 \\ \cdot \\ \cdot \\ \cdot \\ I_{N+1} \end{vmatrix} = G^{-1} \begin{vmatrix} g_1 \\ g_3 \\ \cdot \\ \cdot \\ \cdot \\ g_{2N+1} \end{vmatrix} \times (-1) \qquad (11)$$

In this case, $$G = \begin{vmatrix} g_1{}^1 & g_1{}^2 \ldots g_1^{N+1} \\ g_3{}^1 & g_3{}^2 \ldots g_3^{N+1} \\ \cdot \\ \cdot \\ \cdot \\ g_{2N+1}^1 & g_{2N+1}^2 \ldots g_{2N+1}^{N+1} \end{vmatrix}$$

By causing current values $I_1$ to $I_{N+1}$ determined by the above relationship to flow through respective coil pairs, it is possible to simultaneously cancel errors of up to the $2N+1(=N_m)$th order.

FIRST EMBODIMENT

In this embodiment, the error magnetic fields to be corrected are ones of even order up to the fourth order.

Namely, $N_m=4$. $(1+4/2=3)$ pairs of ring-shaped coils 11P and 11M, 12P and 12M, and 13P and 13M are disposed at positions where the $(2+4=6)$th magnetic field on Z axis is not produced as shown in FIG. 2. The coefficient $g_6(a)$ of the term of the sixth order magnetic field is expressed as follows:

$$g_6(a) \propto (64a^6 - 240a^4 + 120a^2 - 5) \div (1+a^2)^{15/2} \tag{12}$$

Figure 3:
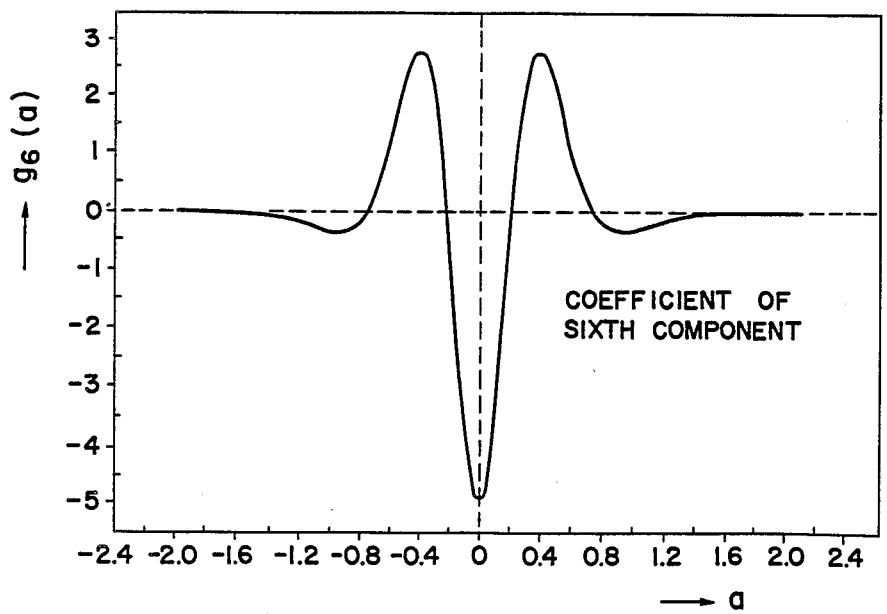

FIG. 3 is a graph plotting the above equation (12) wherein $a = Z_c/r_c$ as previously described in connection with the equation (2). FIG. 2 is a diagrammatical view showing that an angle corresponding to the value of a which gives $g_6(a)=0$, obtained from this graph is indicated on XY plane $(Y \leq 0)$. As shown in FIG. 2, six straight lines P11, P12 and P13, and M11, M12 and M13 which satisfy $g_6(a)=0$ are obtained. Coils 11P, 12P and 13P, and 11M, 12M and 13M are disposed in a manner that axial central positions on their effective radii are positioned on corresponding straight lines, respectively. In this connection, angles of respective straight lines with respect to Z axis are 29.3°, 53.7°, 77.9°, $180° - 29.3° = 150.7°$, $180° - 53.7° = 126.3°$, and $180° - 77.9° = 102.1°$.

The currents of the same direction determined by the equation (8) in accordance with the error magnetic field components included in the fundamental magnetic field are caused to flow through these coils thus disposed, respectively. Thus, it is possible to simultaneously correct the error magnetic fields of even order up to the fourth order with respect to Z axis. Since the correction coils themselves are disposed at positions where the sixth order error magnetic field is not produced, there is no possibility that they produce such sixth order error magnetic field, thus providing the feature that error after correction is also small.

SECOND EMBODIMENT

Figure 4:
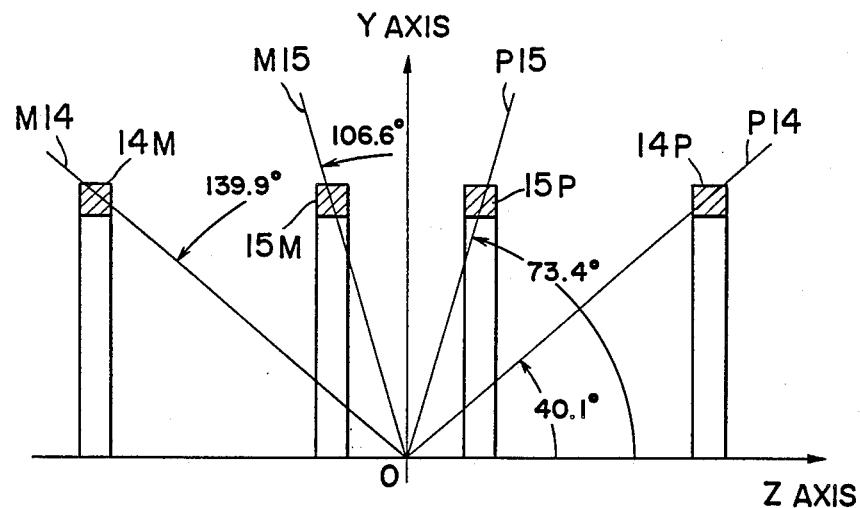

In this embodiment, the error magnetic fields to be corrected are ones of even order up to the second order. Namely, $N_m=2$. As shown in FIG. 4, $(1+2/2=2)$ pairs of ring-shaped coils 14P and 14M, and 15P and 15M are disposed at positions where the $(2+2=4)$th order magnetic field is not produced. The coefficient $g_4(a)$ of the fourth order magnetic field is expressed as follows:

$$g_4(a) \propto 8a^4 - 12a^2 + 1 \div (1+a^2)^{11/2} \tag{13}$$

FIG. 4 is a diagrammatical view plotting positions which give $g_4(a)=0$ obtained from the above equation. In this case, two pairs of coils 14P and 14M, and 15P and 15M are disposed on four straight lines P14 and M14, and P15 and M15 which satisfy $g_4(a)=0$, respectively. Angles of respective straight lines with respect to Z axis are 40.1°, 139.9°, 73.4° and 106.6°.

Currents determined by the above equation (8) in correspondence with error magnetic field components included in the fundamental magnetic field are caused to flow through respective coil pairs. This makes it possible to correct even order error magnetic fields up to the second order.

THIRD EMBODIMENT

In this embodiment, the error magnetic fields to be corrected are even order ones up to the sixth order. $(1+6/2=4)$ pairs of coils 16P and 16M, 17P and 17M, 18P and 18M, and 19P and 19M are disposed at positions where the $(2+6=8)$th order magnetic field is not produced. The coefficient $g_8(a)$ of the term of the eighth order magnetic field is expressed as follows:

$$g_8(a) \propto (128a^8 - 896a^6 + 1134a^4 - 280a^2 + 7) \div (1+a^2)^{19/2} \tag{14}$$

Figure 5:
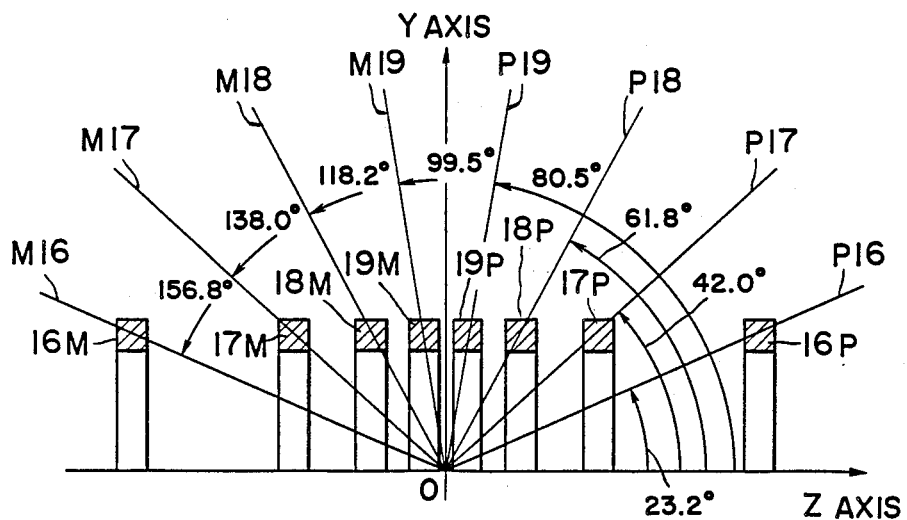

FIG. 5 is a diagrammatical view plotting positions which satisfy $g_8(a)=0$ obtained from the above equation. In this case, four pairs of coils are disposed on eight straight lines P16 and M16, P17 and M17, P18 and M18, and P19 and M19 which satisfy $g_8(a)=0$. Angles of respective straight lines with respect to Z axis are 23.2°, 156.8°, 42.0°, 128.0°, 61.8°, 118.2°, 80.5° and 99.5°. By causing currents determined by the equation (8) to flow through respective coils thus disposed, it is possible to correct the error magnetic field components of even order up to the sixth order.

FOURTH EMBODIMENT

In this embodiment, the error magnetic fields to be corrected are ones of odd order $(N_m=3)$ up to the third order. In this case, $\{1+(3-1)/2=2\}$ pairs of ring-shaped coils 21P and 21M, and 22P and 22M are disposed at positions where the $(2+3=5)$th order magnetic field is not produced as shown in FIG. 6. The coefficient $g_5(a)$ of the term of the fifth order magnetic field is expressed as follows:

$$g_5(a) \propto a(8a^4 - 20a^2 + 5) \div (1+a^2)^{13/2} \tag{15}$$

FIG. 7 is a graph plotting the above equation (15). Coils 21P, 21M, 22P and 22M are disposed on four straight lines P21, M21, P22 and M22 obtained from points which satisfy $g_5(a)=0$, respectively. Angles of respective straight lines with respect to Z axis are 33.9°, 146.1°, 62.0° and 118.0°.

In the above equation (15), $a=0$, i.e., $Z_c=0$ also give the solution of $g_5(a)=0$. However, it is meaningless to dispose a pair of coils for causing currents of the opposite direction to flow in accordance with the present invention. Accordingly, the position of $a=0$ is excluded from the solution.

Currents determined by the equation (11) in correspondence with the error magnetic field components included in the fundamental magnetic field are caused to flow through the two pairs of coils which have been subjected to positioning in this manner. Thus, it is possible to simultaneously correct error magnetic field components of odd order up to the third order with respect to Z axis. Since the correction coils are disposed at positions where the $(N_m+2=5)$th magnetic field is not produced in the same manner as in the case of the even order (the first to third embodiments), there is no possibility that the correction coils themselves produce the fifth order error magnetic field. Thus, the error after correction is also small.

FIFTH EMBODIMENT

In this embodiment, the error magnetic fields to be corrected are ones of odd order up to the fifth order $(N_m=5)$. In this case, $\{1+(5-1)/2=3\}$ pairs of coils 23P and 23M, 24P and 24M, and 25P and 25M are disposed at positions where the $(5+2=7)$th magnetic field is not produced. The coefficient $g_7(a)$ of the term of the seventh magnetic field is expressed as follows:

$$g_7(a) \propto a(64a^6 - 336a^4 + 280a^2 - 35) \div (1+a^2)^{17/2} \tag{16}$$

Figure 8:
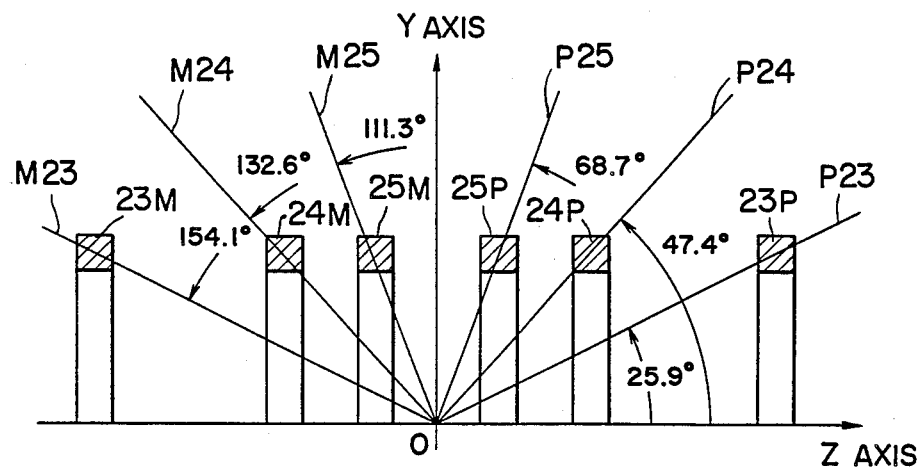
Figure 9:
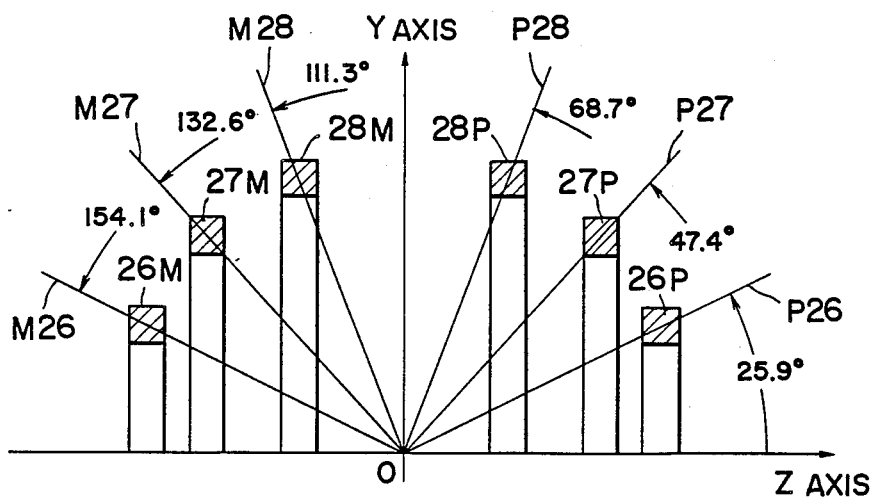

FIG. 8 is a diagrammatical view plotting positions which give $g_7(a)=0$ obtained from the above equation. Three pairs, i.e., six ring-shaped coils are disposed on six straight lines P23, M23, P24, M24, P25 and M25 which satisfy $g_7(a)=0$. Angles of respective straight lines with respect to Z axis are 25.9°, 154.1°, 47.4°, 132.6°, 68.7° and 111.3°. By causing currents determined by the above equation (11) to flow through the respective coil pairs thus disposed in directions opposite to each other, it is possible to simultaneously correct the odd order error magnetic fields up to the fifth order.

SIXTH EMBODIMENT

This embodiment relates to the coil arrangement used for correcting error magnetic fields up to the seventh order in the same manner as in the fifth embodiment. While coils all having the same radii are used in the fifth embodiment (FIG. 8), this embodiments differs from the fifth embodiment in that coils having radii different from each other are used. The coefficient $g_7(a)$ of the seventh order magnetic field is expressed in the same manner as the fifth embodiment. Accordingly, six straight lines P26, P27, P28, M26, M27 and M28 have the same inclination angles as those of the straight lines P23, P24, P25, M23, M24 and M25, respectively. In this case, the positions of the individual coils in the direction of Z axis are different from those in the embodiment shown in FIG. 8 due to the differences between the coil radii. However, in any event, this embodiment is the same as that in FIG. 8 in that effective radii of coils are positioned on respective straight lines correspondingly. The same effects and advantages as those with the embodiment in FIG. 8 can be achieved also by this embodiment. Since a desired correction magnetic field space is easily realized because of the coil radius becoming small, the advantage that it is sufficient that the magnetomotive force required for correction is small can be obtained.

The concept using coils of different radii according to this embodiment is applicable to the above-described first to fourth embodiments.

As appreciated from the foregoing description, the coil arrangement according to the present invention makes it possible to precisely correct even or odd order error magnetic fields with respect to Z axis using a less number of coils.

The coil arrangement according to the present invention can be of course constituted not only with the normal conducting coil but also with the superconducting coil.

What is claimed is:

1. A coil arrangement for correction of a fundamental magnetic field directed along the Z axis of the Cartesian coordinate system, including a coil arrangement with at least one pair of ring-shaped coils for correcting error magnetic field components with respect to said Z axis included in said fundamental magnetic field, one of the two ring-shaped correction coils of each pair being coaxially disposed symmetrically on the both sides, respectively, of a Z axis reference point taken as the center of the said Z axis, the improvement wherein when the maximum order of said error magnetic field components to be corrected with respect to said Z axis is assumed as $N_m$, said maximum order $N_m$ being even, $(1+N_m/2)$ pairs of ring-shaped correction coils being positioned along the Z axis where $(N_m+2)$th order error magnetic field components are not produced.

2. An arrangement as set forth in claim 1, wherein two pairs of ring-shaped coils are provided for correcting error magnetic field components of even order equal to the second order or less, said ring-shaped coils being disposed in a manner that lines connecting the central position in the axial direction on their effective radii to said Z axis reference point make angles of approximately 40.1°, 73.4°, 106.6° and 139.9° with respect to said Z axis, respectively.

3. An arrangement as set forth in claim 2, wherein three pairs of ring-shaped coils are provided for correcting error magnetic field components of even order equal to the fourth order or less, said ring-shaped coils being disposed in a manner that lines connecting the central positions in the axial direction on their effective radii to said Z axis reference point make angles of approximately 29.3°, 53.7°, 77.9°, 102.1°, 126.3° and 150.7° with respect to said Z axis, respectively.

4. An arrangement as set forth in claim 2, wherein four pairs of ring-shaped coils are provided for correcting error magnetic field components of even order equal to the sixth order or less, said ring-shaped coils being disposed in a manner that lines connecting the central positions in the axial direction on their effective radii to said Z axis reference plane make angles of approximately 23.2°, 42.0°, 61.8°, 80.5°, 99.5°, 118.2°, 138.0° and 156.8°, respectively.

5. A coil arrangement for correction of a fundamental magnetic field directed along the Z axis of the Cartesian coordinate system, including a coil arrangement with at least one pair of ring-shaped coils for correcting error magnetic field components with respect to said Z axis included in said fundamental magnetic field, each of the two ring-shaped correction coils composed of one pair is coaxially disposed symmetrically on the both sides, respectively, of a Z axis reference point taken as the center of the said Z axis, the improvement wherein when the maximum order of said error magnetic field components to be corrected with respect to said Z axis is assumed as $N_m$, the maximum order $N_m$ being odd, $(1+(N_m-1)/2)$ pairs of ring-shaped correction coils being positioned where $(N_m+2)$th order error magnetic field components are not produced.

6. An arrangement as set forth in claim 5, wherein two pairs of ring-shaped coils are provided for correcting error magnetic field components of odd order equal to the third order or less, said ring-shaped coils being disposed in a manner that lines connecting the central positions in the axial direction on their effective radii to said Z axis reference lines make angles of approximately 33.9°, 62.0°, 118.0°, and 146.1°, respectively.

7. An arrangement as set forth in claim 5, wherein three pairs of ring-shaped coils are provided for correcting error magnetic field components of odd order equal to the fifth order or less, said ring-shaped coils being disposed in a manner that lines connecting the central positions in the axial direction on their effective radii to said Z-axis reference planes make angles of approximately 25.9°, 47.4°, 68.7°, 111.3°, 132.6° and 154.1°, respectively.

* * * * *